(12) United States Patent
Buckland (10) Patent No.: US 11,225,961 B2
(45) Date of Patent: Jan. 18, 2022

(54) MULTI-ELEMENT BENDING TRANSDUCERS AND RELATED METHODS AND DEVICES

(71) Applicant: Sensus Spectrum LLC, Morrisville, NC (US)

(72) Inventor: Justin Rorke Buckland, Cambridge (GB)

(73) Assignee: Sensus Spectrum, LLC, Morrisville, NC (US)

( * ) Notice: Subject to any disclaimer, the term of this patent is extended or adjusted under 35 U.S.C. 154(b) by 853 days.

(21) Appl. No.: 15/887,065

(22) Filed: Feb. 2, 2018

(65) Prior Publication Data

US 2018/0242066 A1 Aug. 23, 2018

Related U.S. Application Data (60) Provisional application No. 62/461,610, filed on Feb. 21, 2017.

(51) Int. Cl.
*H04R 1/06* (2006.01)
*F04B 43/04* (2006.01)
(Continued)

(52) U.S. Cl.
CPC ............. *F04B 43/046* (2013.01); *B06B 1/06* (2013.01); *B06B 1/0603* (2013.01); *B06B 1/0688* (2013.01); *F04B 45/047* (2013.01); *G10K 11/004* (2013.01); *H01L 41/047* (2013.01); *H01L 41/0475* (2013.01); *H01L 41/0477* (2013.01); *H01L 41/0973* (2013.01); *H01L 41/29* (2013.01); *H01L 41/313* (2013.01); *H04R 1/06* (2013.01); *H04R 17/00* (2013.01)

(58) Field of Classification Search
CPC .. H04R 1/06; H04R 17/00; B06B 1/06; B06B 1/0603; B06B 1/0688; F04B 3/046; F04B 45/047; G10K 11/004; H01L 41/047; H01L 41/0475; H01L 41/0477; H01L 41/0973; H01L 41/29; H01L 41/313
USPC .......................................... 310/311–371, 800
See application file for complete search history.

(56) References Cited

U.S. PATENT DOCUMENTS 4,424,465 A * 1/1984 Ohigashi ............... B06B 1/0622
310/335
4,523,122 A 6/1985 Tone et al.
(Continued)

OTHER PUBLICATIONS

Notification Concerning Transmital of International Preliminary Report on Patentability, PCT/US2018/016604, dated Sep. 6, 2019, 10 pages.
(Continued)

*Primary Examiner* — Bryan P Gordon
(74) *Attorney, Agent, or Firm* — Stanek Lemon Crouse & Meeks, PA (57) ABSTRACT

Bending mode transducers are provided including a substrate made of a high density material, the substrate having a first surface and a second surface, opposite the first surface. A piezoelectric layer is provided on the first surface of the substrate and at least one patterned electrode is provided on the piezoelectric layer. A mounting block is on the at least one patterned electrode at least one electrical contact point is provided on the first surface of the substrate remote from the at least one patterned electrode. Related devices and methods are also provided.

18 Claims, 10 Drawing Sheets

(51) Int. Cl.
  *B06B 1/06*  (2006.01)
  *H04R 17/00* (2006.01)
  *H01L 41/29* (2013.01)
  *G10K 11/00* (2006.01)
  *H01L 41/313* (2013.01)
  *F04B 45/047* (2006.01)
  *H01L 41/047* (2006.01)
  *H01L 41/09* (2006.01)

(56) References Cited

U.S. PATENT DOCUMENTS

| | | | | |
|---|---|---|---|---|
| 4,704,774 | A * | 11/1987 | Fujii | B06B 1/0622 |
| | | | | 29/25.35 |
| 5,295,487 | A * | 3/1994 | Saitoh | B06B 1/06 |
| | | | | 310/334 |
| 5,539,965 | A * | 7/1996 | Safari | B06B 1/06 |
| | | | | 29/25.35 |
| 5,920,972 | A * | 7/1999 | Palczewska | B06B 1/064 |
| | | | | 29/25.35 |
| 6,014,898 | A | 1/2000 | Finsterwald et al. | |
| 6,989,625 | B2 | 1/2006 | Suzuki et al. | |
| 2001/0046107 | A1 | 11/2001 | Irie et al. | |
| 2003/0214200 | A1 | 11/2003 | Thompson et al. | |
| 2004/0070315 | A1 | 4/2004 | Takeuchi et al. | |
| 2005/0015953 | A1* | 1/2005 | Keidar | H04R 31/00 |
| | | | | 29/25.35 |
| 2006/0169055 | A1 | 8/2006 | Agam et al. | |
| 2013/0140955 | A1 | 6/2013 | Chaggares et al. | |
| 2013/0241355 | A1* | 9/2013 | Okada | H01L 41/25 |
| | | | | 310/334 |
| 2014/0184023 | A1 | 7/2014 | Rice et al. | |
| 2014/0350407 | A1* | 11/2014 | Chaggares | B06B 1/06 |
| | | | | 600/459 |
| 2015/0295159 | A1 | 10/2015 | Wada et al. | |
| 2018/0226566 | A1* | 8/2018 | Zawada | B06B 1/0662 |
| 2018/0242066 | A1* | 8/2018 | Buckland | G10K 11/004 |

OTHER PUBLICATIONS

Notification of Transmittal of the International Search Report and the Written Opinion of the International Searching Authority, or the Declaration, PCT/US2018/016604, dated May 8, 2018, 13 pages.
Gomez Alvarez-Aren et al., "Novel Impedance Matching Materials and Strategies for Air-Coupled Piezoelectric Transducers," IEEE Sensors, 2013, 4 pages.
Gomez Alvarez-Arenas, Tomas E., "A Nondestructive Integrity Test for Membrane Filters Based on Air-Coupled Ultrasonic Spectroscopy," IEEE Transactions on Ultrasonics, Ferroelectrics, and Frequency Control, vol. 50, No. 6, Jun. 2003, pp. 676-685.
Gomez Alvarez-Arenas, Tomas E., "Acoustic Impedance Matching of Piezoelectric Transducers to the Air," IEEE Transactions on Ultrasonics, Ferroelectrics, and Frequency Control, vol. 51, No. 5, May 2004, pp. 624-633.
Percin et al. "Piezoelectrically actuated flextensional micromachined ultrasound transducers," Ultrasonics, vol. 40, 2002, pp. 441-448.
Piezoelectric Tonpilz Transducer, Consol Application Gallery, Prior Art, Printed from the Internet at https://www.comsol.com/model/piezoelectric-tonpilz-tranducers-11478: 52 pages.

* cited by examiner

| DESIGN | FREQUENCY (kHz) | TRANSDUCER AREA (mm$^2$) | VELOCITY (mm/s p-p) | VELOCITY x AREA (mm$^3$/s) | MICROPHONE SIGNAL (Vpp) | GAIN Rx/Tx (dB(V/V)) |
|---|---|---|---|---|---|---|
| CURRENT SENSOR | 170 | 38 | 172 | 6619 | 3.83 | -44 |
| BENDING MODE, LF NO MATCHING LAYER | 175 | 30 | 498 | 15144 | 1.44 | -66 |
| BENDING MODE, HF NO MATCHING LAYER | 330 | 22 | 141 | 3039 | 1.91 | -80 |

MULTI-ELEMENT BENDING TRANSDUCERS AND RELATED METHODS AND DEVICES

CLAIM OF PRIORITY

This application claims priority to U.S. Provisional Application Ser. No. 62/461,610, filed on Feb. 21, 2017, entitled "Multi-element Bending Transducers and Related Methods and Devices", the content of which is hereby incorporated herein by reference as if set forth in its entirety.

CROSS REFERENCE TO RELATED APPLICATIONS

This application is related to U.S. application Ser. No. 15/374,044, filed Dec. 9, 2016, entitled "Thickness Mode Transducers and Related Devices and Methods," and U.S. application Ser. No. 15/374,129, filed Dec. 9, 2016, entitled "Thickness-Planar Mode Transducers and Related Devices," the disclosures of which are hereby incorporated herein by reference as if set forth in their entirety.

FIELD

The present inventive concept relates generally to transducers and, more particularly, to ultrasonic transducers and related methods and devices.

BACKGROUND

Ultrasonic transducers, for example, ultrasonic gas transducers, preferably include small but precisely dimensioned piezoelectric components in order to provide a high degree of part-to-part repeatability with low material costs. Conventional devices are very expensive to manufacture and have undesirable part-to-part variability, typically requiring transducer pairs to be matched for ultrasonic time-of-flight flow measurement.

Some conventional devices use a cylindrical piezoelectric component having a thickness that defines the resonant frequency, in combination with one or two acoustic matching layers. Thus, the element thickness would be approximately 7.00 mm for operation at a frequency of 170 kHz and 3.00 mm for operation at a frequency of 400 kHz. Manufacturing precisely dimensioned piezoelectric cylinders of this size and shape can be very expensive as the cylinder faces have to be machined after firing.

Furthermore, inconsistent mounting of the transducer within a housing can be a problem with conventional approaches, where the piezoelectric component is potted in an enclosure to provide mechanical support and a degree of vibrational damping. The potting process can be inconsistent, can require long curing times and can be labor-intensive, possibly leading to variability in transducer behavior and higher manufacturing costs.

Another problem that has been observed with conventional approaches in gas flow and speed of sound measurement is that the acoustic impedance of the piezoelectric transducer is very high compared to that of methane and other gases, thus generally requiring the use of intermediate impedance acoustic matching layers to increase transmission efficiency. The acoustic matching layers can be difficult to manufacture and can have significant part-to-part variation in acoustic properties, adding to the variability of the transducer performance.

An effective acoustic impedance of a bending mode transducer is typically lower than that of a thickness mode transducer, so a matching layer might not be needed. However bending mode transducers commonly use an adhesively bonded piezoelectric layer and substrate and are sensitive to small alignment errors between these parts, possibly leading to undesirable variability in the transducer resonant frequency and acoustic output.

The acoustic output of a single bending element transducer is proportional to its area, which reduces as its resonant frequency increases and as the thickness decreases, but high frequencies may be required for ultrasonic time-of-flight measurement with a compact flow tube and low thickness is desirable for more efficient acoustic transmission to a gas. The resulting small area of a single element bending mode transducer leads to low acoustic output, undesirably wide acoustic beam width and low sensitivity.

Furthermore, there is a need to make electrical connections to the piezoelectric component. Conventional devices typically use a soldered wire. However soldered wires can be unreliable and may cause increased part-to-part variability as the mass and placement of solder may be poorly controlled and can have a significant effect on the transducer vibrational behavior. At high frequencies the size of the piezoelectric component decreases and these problems generally become more severe.

SUMMARY

Some embodiments of the present inventive concept provide bending mode transducers including a substrate having a first surface and a second surface, opposite the first surface; a piezoelectric layer on the first surface of the substrate; at least one patterned electrode on the piezoelectric layer; a mounting block on the at least one patterned electrode; and at least two electrical contact points on the at least one patterned electrode.

In further embodiments, the alignment features may be provided on the substrate and/or the mounting block to facilitate alignment during a fabrication process. In certain embodiments, the alignment features may include plurality of holes and slots in the substrate and/or the mounting block.

In still further embodiments, the substrate may include stainless steel and may have a thickness of from about 10 µm to about 500 µm.

In some embodiments, the mounting block may include one of a ceramic material and an electrically insulating material.

In further embodiments, an acoustic matching layer may be provided on the second surface of the substrate.

In still further embodiments, the piezoelectric layer may include PZT material and the piezoelectric layer may have a thickness of from about 20 µm to about 1000 µm.

In some embodiments, the at least one patterned electrode may include a plurality of patterned electrodes.

In further embodiments, the transducer may be an ultrasonic transducer configured for one of a gas meter, a water meter and a heat meter.

Still further embodiments of the present inventive concept provide devices including at least one transducer and the at least one transducer includes a substrate having a first surface and a second surface, opposite the first surface; a piezoelectric layer on the first surface of the substrate; at least one patterned electrode on the piezoelectric layer; a mounting block on the at least one patterned electrode; and at least two electrical contact points on the at least one patterned electrode.

Some embodiments of the present inventive concept provide methods of fabricating transducers including providing a substrate including a high density material, the substrate having a first surface and a second surface, opposite the first surface; bonding a piezoelectric layer and electrodes to the first surface of the substrate; patterning the electrodes to provide at least one patterned electrode on the piezoelectric layer; and bonding a mounting block to the piezoelectric layer and the at least one patterned electrode.

In further embodiments, patterning the electrodes may include patterning the electrodes using a laser ablation process.

In still further embodiments, the electrodes may include one of gold, nickel and silver.

In some embodiments, bonding the piezoelectric layer and the electrode further includes applying an adhesive to a surface of the substrate and/or the piezoelectric layer; compressing the substrate and the piezoelectric layer including the at least one patterned electrode together; and curing the adhesive such that the substrate and the piezoelectric layer are bonded.

In further embodiments, curing may include curing the adhesive under heat and pressure.

In still further embodiments, curing may be followed by aligning the substrate with the mounting block using alignment features on the substrate and/or mounting block to facilitate alignment during a bonding process.

In some embodiments, the alignment features may include a plurality of holes and slots in the substrate and/or the piezoelectric layer.

In further embodiments, the transducers may be separated by partitioning the substrate.

In still further embodiments, separating may further include cutting the substrate on connecting tabs; and breaking the mounting block along laser-cut scribe lines.

In some embodiments, the mounting block may include one of a ceramic material and an electrically insulating material.

DETAILED DESCRIPTION

The present inventive concept will be described more fully hereinafter with reference to the accompanying figures, in which embodiments of the inventive concept are shown. This inventive concept may, however, be embodied in many alternate forms and should not be construed as limited to the embodiments set forth herein.

Accordingly, while the inventive concept is susceptible to various modifications and alternative forms, specific embodiments thereof are shown by way of example in the drawings and will herein be described in detail. It should be understood, however, that there is no intent to limit the inventive concept to the particular forms disclosed, but on the contrary, the inventive concept is to cover all modifications, equivalents, and alternatives falling within the spirit and scope of the inventive concept as defined by the claims. Like numbers refer to like elements throughout the description of the figures.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the tetras "comprises", "comprising," "includes" and/or "including" when used in this specification, specify the presence of stated features, integers, steps, operations, elements, and/or components, but do not preclude the presence or addition of one or more other features, integers, steps, operations, elements, components, and/or groups thereof. Moreover, when an element is referred to as being "responsive" or "connected" to another element, it can be directly responsive or connected to the other element, or intervening elements may be present. In contrast, when an element is referred to as being "directly responsive" or "directly connected" to another element, there are no intervening elements present. As used herein the term "and/or" includes any and all combinations of one or more of the associated listed items and may be abbreviated as "/".

Unless otherwise defined, all terms (including technical and scientific terms) used herein have the same meaning as commonly understood by one of ordinary skill in the art to which this inventive concept belongs. It will be further understood that terms used herein should be interpreted as having a meaning that is consistent with their meaning in the context of this specification and the relevant art and will not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element without departing from the teachings of the disclosure. Although some of the diagrams include arrows on communication paths to show a primary direction of communication, it is to be understood that communication may occur in the opposite direction to the depicted arrows.

As discussed in the background of the inventive concept, improvements to ultrasonic transducers may be needed to provide more reliable less expensive devices. Accordingly, some embodiments of the present inventive concept provide a multi-element bending mode transducer for ultrasonic time-of-flight flow measurements. As will be discussed herein, in some embodiments, multiple bending transducer elements operate in parallel to increase the acoustic output of the transducer. The transducer may include a substrate sheet, piezoelectric layer having a laser-patterned electrode, and a rigid mounting block containing multiple apertures in register with the laser-patterned electrode. In some embodiments, the patterned electrode may include electrical contacts to drive the transducer, and these electrical contact points may be located remotely from the parts of the transducer that move when the electrical drive is applied. Thus, embodiments of the present inventive concept may allow precisely controlled, low cost manufacture and convenient electrical contact using conductive tracks on the mounting block as will be discussed further below with respect to FIGS. 1 through 15.

Figure 1A:
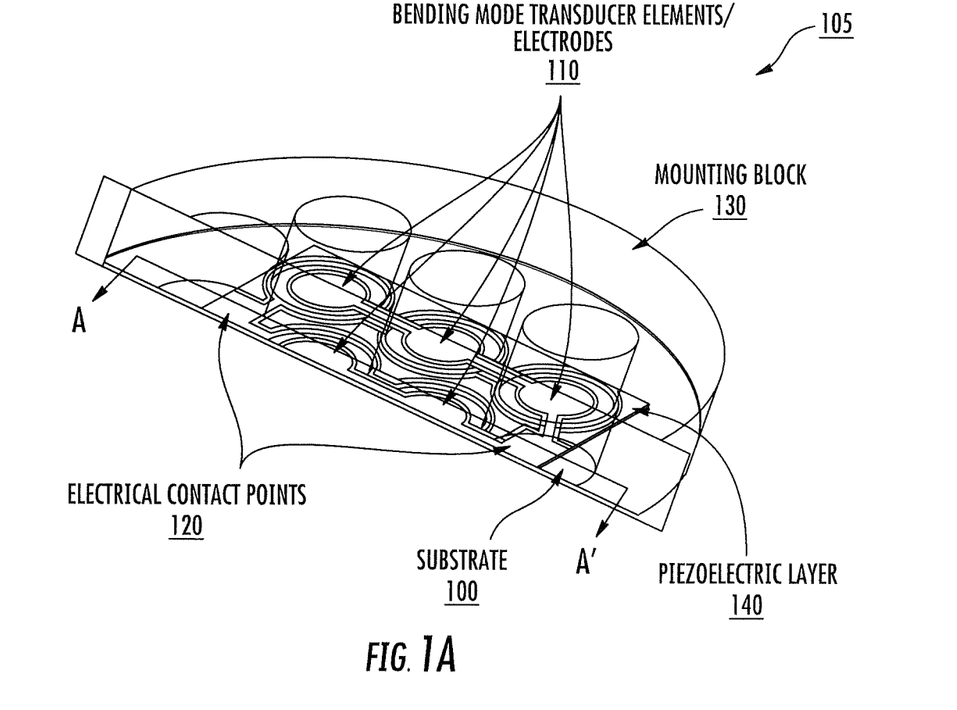
FIG. 1A is a diagram illustrating a cross section of a plan view of a multi-element bending mode transducer in accordance with some embodiments of the present inventive concept.

Referring now to FIG. 1, a cross-section of a plan view of a multi-element bending mode transducer 105 in accordance with some embodiments of the present inventive concept will be discussed. As illustrated in FIG. 1A, the multi-element bending mode transducer 105 includes a piezoelectric layer 140 and a plurality of electrical contact points 120 on a substrate 100. The piezoelectric layer 140 may include a plurality of bending transducer elements/electrodes 110 as shown and a mounting block 130 may be provided thereon. The electrodes may be, for example, one of gold, nickel and silver. In some embodiments the substrate 100 may be a stainless steel substrate, however, embodiments of the present inventive concept may not be limited to this configuration. For example, the substrate 100 may be aluminum, titanium or brass without departing from the scope of the present inventive concept. In some embodiments, the substrate may have a thickness of from about 25 μm to about 500 μm. In some embodiments, the thickness of the substrate 100 may be about 40 μm.

The piezoelectric layer 140 may include materials that produce an electric current when they are placed under mechanical stress. For example, the piezoelectric layer 140 may include lead zirconate titanate (Pb[Zr(x)Ti(1-x)]O3) (PZT). PZT is one of the world's most widely used piezoelectric ceramic materials. However, embodiments of the present inventive concept are not limited to PZT. The piezoelectric chip/layer may have a length of 7.0 mm, a width of 8.0 mm and a thickness of 0.1 mm (100 μm) on the substrate 100. It will be further understood that as used herein "piezoelectric layer" refers generally to any layer made of piezoelectric material, for example, the piezoelectric layer may be one or more piezoelectric tiles, a chip, an element and the like without departing from the scope of the present inventive concept.

In some embodiments, the mounting block 130 may have a thickness of 0.5 mm to 10.0 mm. In some embodiments, the mounting block may be 2.0 mm thick. The mounting block 130 may be a ceramic material, for example, alumina or Macor or any ceramic material suitable for use with embodiments discussed herein. In some embodiments, the mounting block 130 may include electrically conducting vias or apertures to allow electrical contact with the patterned electrode.

Figure 3A:
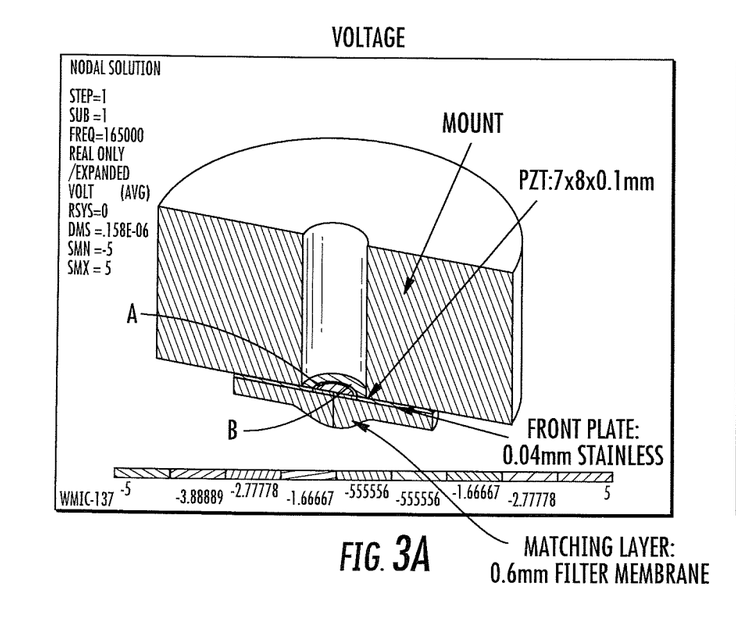
FIGS. 3A and 3B are simulations of a single element bending mode transducer in accordance with some embodiments of the present inventive concept.

Although not illustrated in FIG. 1A, some embodiments of the present inventive concept include an acoustic matching layer on a front plate of the transducer (see FIG. 3A). Acoustic matching layers are used to improve acoustic transmission efficiency between a high acoustic impedance acoustic element (PZT, impedance $Z_1$) and a low acoustic impedance medium (gas, impedance $Z_3$). The acoustic impedance of a material is defined as the product of density and speed of sound.

In the case of a single matching layer, the ideal matching layer acoustic impedance, $Z_2$, is the geometric mean of the transducer and gas acoustic impedances:

$$Z_2 = \sqrt{Z_1 Z_3}$$ Eqn. (1)

TABLE 1

| Material | Acoustic Impedance (kg/m²·s) |
| --- | --- |
| PZT 5A | $34 \times 10^6$ |
| methane (1 atm, 20 C.) | 300 |
| matching layer (ideal) | $1 \times 10^5$ |

The acoustic impedance of a material is equal to the product of the speed of sound in the material and the density of the material. To obtain a low acoustic impedance matching layer as listed in Table 1 typically requires a matching layer composed of a solid material with very low speed of sound and low density. However, in general suitable materials do not occur naturally and have to be constructed with special manufacturing processes. For example, suspensions of hollow glass microspheres in epoxy resin are used in the some conventional transduces, matching layers using glass and resin microspheres are discussed, for example, in U.S. Pat. No. 4,523,122 and a matching layer using a dry gel material is discussed in, for example, U.S. Pat. No. 6,989,625, the disclosures of which are incorporated herein by reference as if set forth in their entirety. In some embodiments, the acoustic matching layer may be a filter membrane having a thickness of about 0.6 mm. Embodiments of the present inventive concept may use any acoustic matching layer without departing from the scope of the present inventive concept. Embodiments with and without acoustic matching layers will be discussed further below.

Transducers 105 as discussed with respect to embodiments herein have been constructed with a number of design features to enable low cost, repeatable manufacture and large output area to address issues discussed above with respect to conventional devices. For example, transducers according to some embodiments of the present inventive concept may include a laser-patterned electrode on the piezoelectric layer, a mounting block 130 on a face of the transducer and an optional metallization of the mounting block to provide an alternative electrical contact.

In particular, the laser-patterned electrode on a piezoelectric layer may include multiple bending transducers 110 on the single substrate 100. By electrically isolating a front face of the transducer, a differential drive may be provided. In some embodiments, the patterned electrode may have a central region and a surrounding annular region, the central and annular regions being electrically isolated from each other. The electrode on the piezoelectric layer on the side in contact with the substrate may be electrically isolated from the patterned electrode.

Transducers according to embodiments discussed herein may have reduced sensitivity to lateral alignment of the piezoelectric layer with the substrate 100. As illustrated in FIG. 1A, electrical contacts 120 may be located away from a moving portion of the transducer, allowing electrical contact with, for example, soldered wires, pins or flexible circuits, and reducing the influence of the electrical contact on the vibrational behavior of the transducer.

The substrate 100 on the front face may provide a flat front portion of the transducer, which may allow increased reflection of acoustic pulses to allow speed-of-sound determination from the pulse-echo response of a transducer. In some embodiments, the mounting block may be metallized to provide an electrical contact, for example, the mounting block may be a ceramic printed circuit board (PCB) without departing from the scope of the present inventive concept.

Figure 1B:
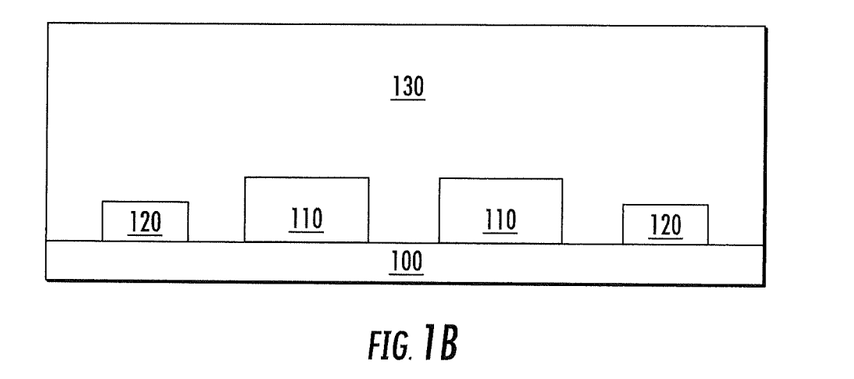
FIG. 1B is a cross-section of the transducer of FIG. 1A along the line A-A'.

Referring to FIG. 1B, a cross section across line A-A' will be discussed. As illustrated in FIG. 1B, the transducer elements 110 are positioned between the electrical contact points 120 on the substrate 100. As discussed above, the electrical contact points 120 may be located away from a moving portion of the transducer, allowing electrical contact with, for example, soldered wires, pins or flexible circuits, and reducing the influence of the electrical contact on the vibrational behavior of the transducer.

Figure 2:
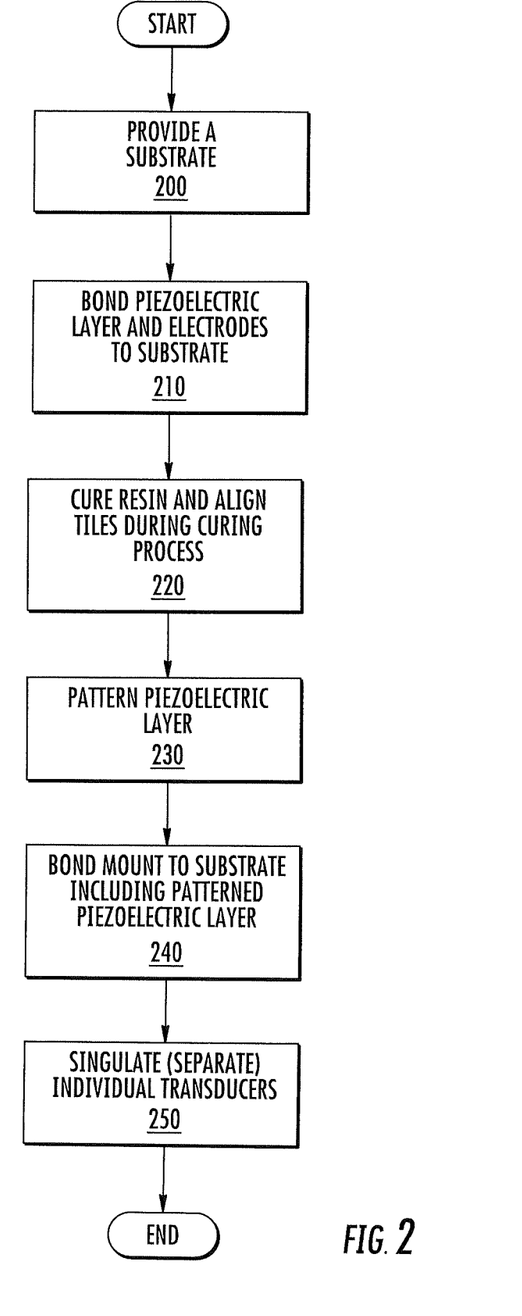
FIG. 2 is a flowchart illustrating processing steps in the fabrication of transducers in accordance with some embodiments of the present inventive concept.

Referring now to FIG. 2, a flowchart illustrating processing steps in the fabrication of multi-element bending transducers in accordance with some embodiments of the present inventive concept will be discussed. As illustrated in FIG. 2, operations begin at block 200 by providing a substrate. As discussed above, in some embodiments, the substrate 200 may be stainless steel etched substrates, for example, PZT grade 3221 HD made by CTS Corporation. However, embodiments of the present inventive concept are not limited to this configuration. Operations proceed to block 210 where a piezoelectric layer is bonded to the substrate. In some embodiments, the piezoelectric layer comprises one or more piezoceramic tiles having dimensions of about 7.0× 8.0×0.1 mm and are bonded to stainless steel etched substrates. In some embodiments, both the piezoceramic tiles and electrodes, for example, 1.2 µm evaporated gold electrodes, are bonded to the substrate. The tiles and the electrodes may be bonded to the substrate by any means known to those having skill in the art. In some embodiments, an unfilled 2-part thermally cured epoxy resin may be used to bond the tiles and the electrodes to the substrate. For example, the resin may be Epotek 353-NDT provided by Epoxy Technology, Inc.

During the curing process, a mechanical alignment fixture may be used to align and compress the piezoelectric tiles (block 220). Once the bond is sufficiently cured, the tiles may be patterned (block 230). For example, in some embodiments, laser ablation may be used to pattern the electrodes. In some embodiments, the substrate includes alignment means to facilitate alignment during the patterning process. For example, in some embodiments the substrate may include features, such as notches, slots or holes to facilitate alignment. The patterned structure may then be bonded to a mounting block (block 240) using an adhesive, for example, an epoxy as discussed above. As discussed above, the mounting block may be any type of electrically insulating material suitable for use in accordance with embodiments discussed herein. It will be understood that both the mounting block and substrate may contain the alignment/location features to provide alignment during bonding.

After the structure is bonded, the transducers may be singulated (separated) (block 250). In some embodiments, the transducers may be singulated by cutting the substrate connecting tabs and breaking the mounting block along laser-cut scribe lines. However, it will be understood that embodiments of the present inventive concept are not limited to this configuration.

Figure 3B:
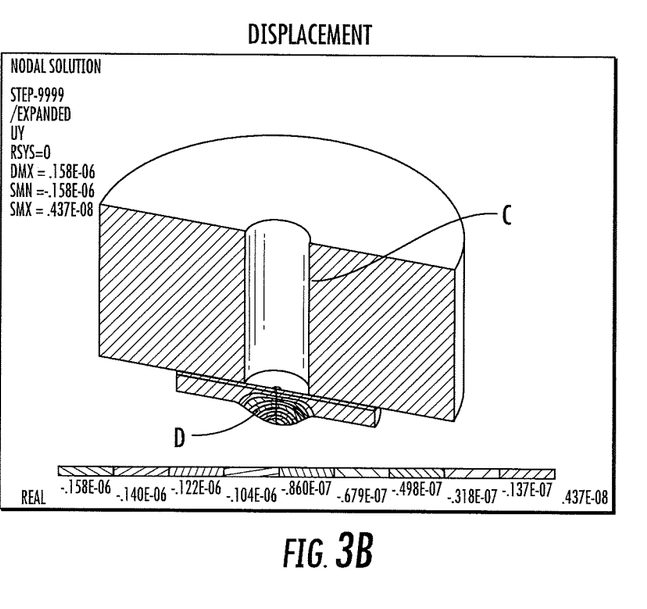

Referring now to FIGS. 3A and 3B, axisymmetric simulations of a single element bending mode transducer will be discussed. The transducers simulated in FIGS. 3A and 3B were provided on a Macor mounting block with an optional acoustic matching layer. It is noted that the benefit (increased velocity factor) provided by the matching layer for embodiments of the present inventive concept is less than with a conventional thickness mode transducer.

Figure 4:
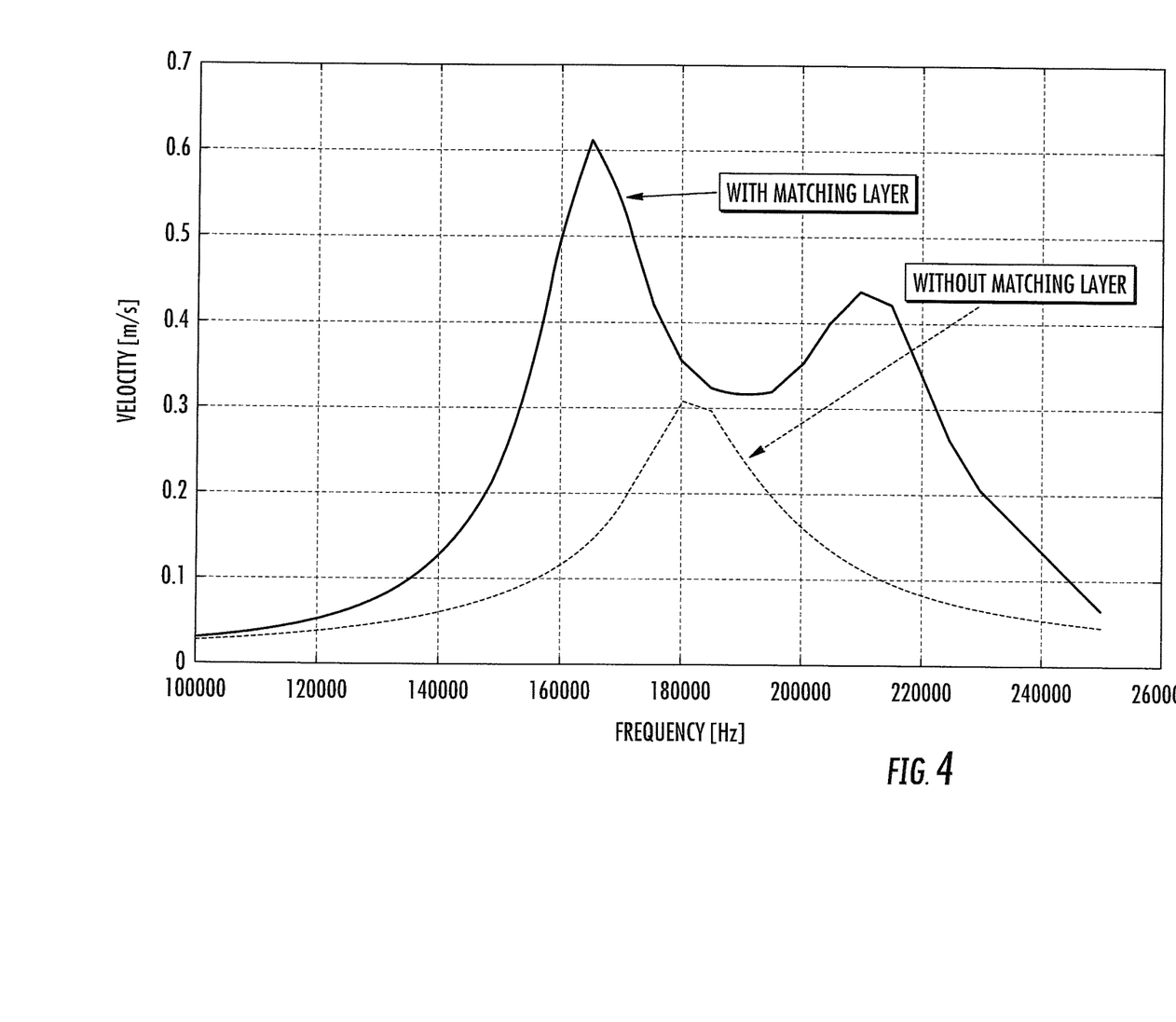
FIG. 4 is a graph illustrating frequency vs. velocity for embodiments with and without a matching layer in accordance with some embodiments of the present inventive concept.

Referring first to FIG. 3A, in the axisymmetric simulation of a single element bending mode transducer the shading indicates applied voltage light grey (A) illustrates +5V and dark grey (B) illustrates −5V. FIG. 3B illustrates axial velocity, where dark grey (C) is stationary and light grey (D) is moving downwards. FIG. 4 illustrates a graph of velocity vs. frequency showing simulations with (upper trace) and without (lower trace) the optional matching layer.

Figure 5:
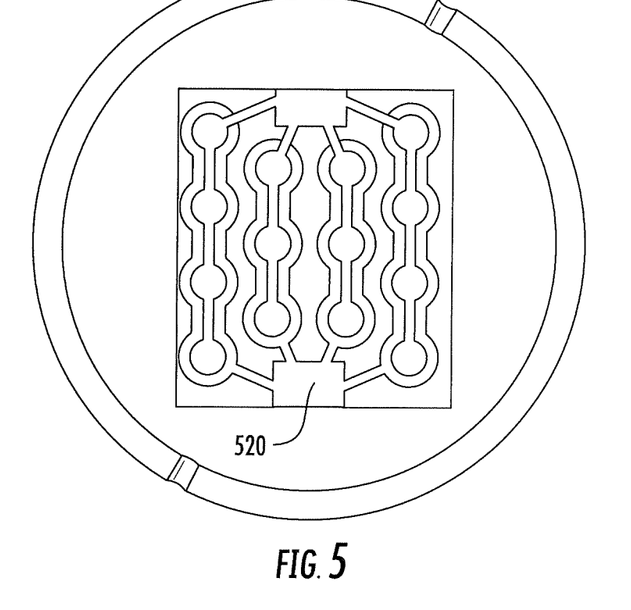
FIG. 5 is a diagram of a photograph of a single piezoelectric layer bonded to a stainless steel substrate after having been laser patterned in accordance with some embodiments of the present inventive concept.
Figure 6:
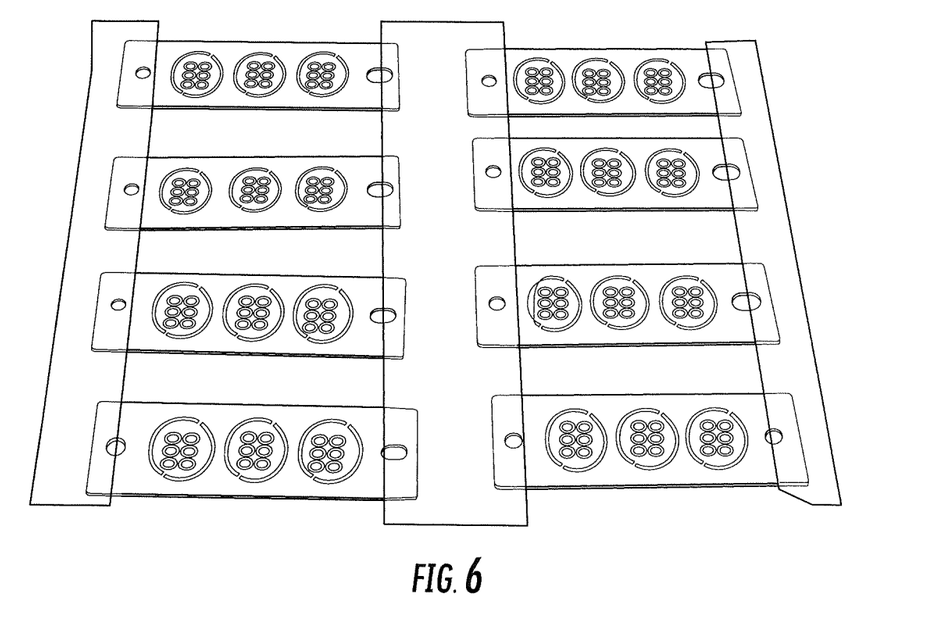
FIG. 6 is a diagram of a photograph of the piezoelectric layers after having been laser patterned in accordance with some embodiments of the present inventive concept.
Figure 7:
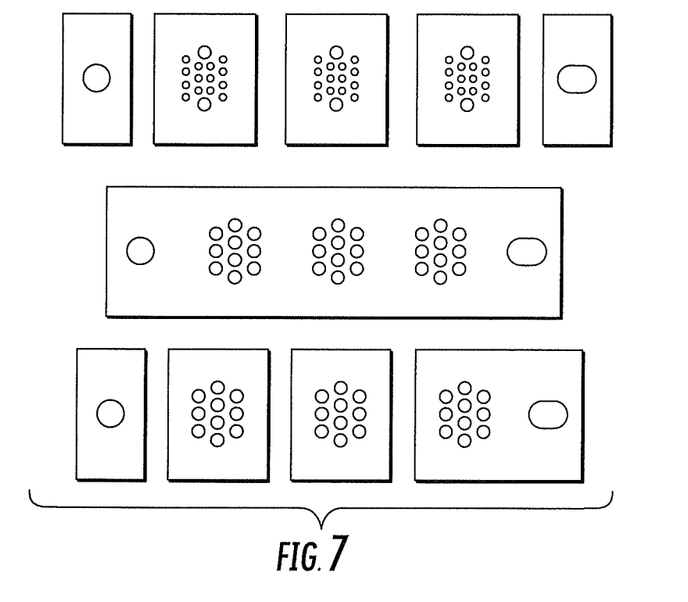
FIG. 7 is a photograph of the piezoelectric layers bonded to the stainless steel substrate and the mounting block and subsequently separated into single transducers in accordance with some embodiments of the present inventive concept.

The diagrams of images in FIGS. 5 through 7 illustrate the various processing steps in the fabrication of transducers in accordance with some embodiments discussed herein. For example, FIGS. 5 and 6 illustrate the PZT chips (7×8×0.1 mm) bonded to a stainless steel substrates and subsequently laser-patterned. As clearly illustrated in the enlarged view of a single element in FIG. 5, the square spaces at the sides illustrate electrical contact points 520 as discussed above. These electrical contact points 520 may include means for connecting the transducers, for example, spring contacts or metalized tracks to make electrical contact. FIG. 7 further illustrates the mounting block bonded to PZT-substrate assembly and subsequently singulated.

Figure 8:
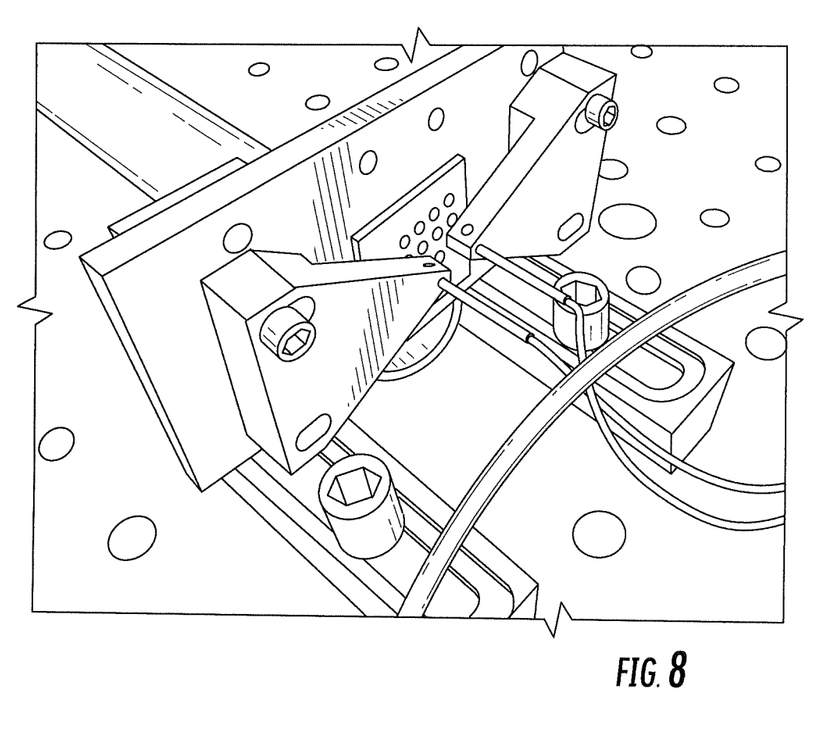
FIGS. 8 and 9 are diagrams of photographs of a transducer mount and a transmit receive test fixture, respectively.
Figure 9:
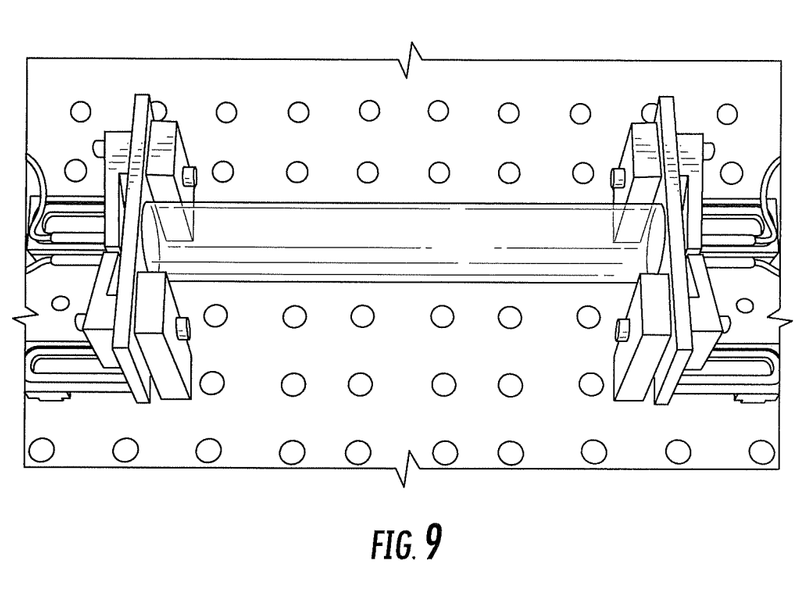
Figure 10:
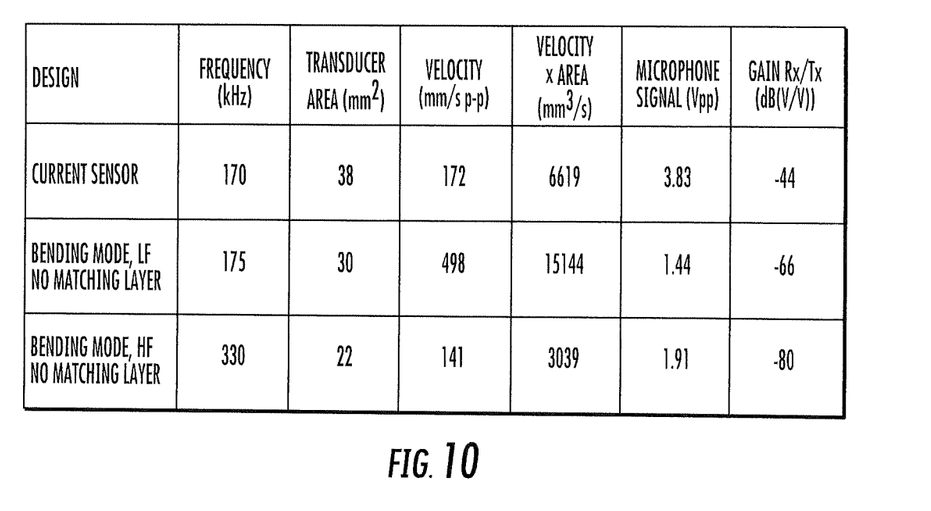
FIG. 10 is a table comparing parameters of transducers in accordance with embodiments of the present inventive concept and conventional transducers.

Tests were performed to confirm performance in accordance with some embodiments discussed herein. FIGS. 8 and 9 illustrate the mechanical positioning of the transducers in a transducer mount (FIG. 8) and included in a transmit and receive test fixture (FIG. 9). Details of the testing will now be discussed and are illustrated in the table of FIG. 10 and graphs of FIGS. 11-14. Transducers in accordance with embodiments of the present inventive concept were mounted to a test fixture (FIG. 9) with electrical contact via spring probes (RS Stock No. 261-5092) contacting in the electrode contact area away from the vibrating part of the transducer. Electrical impedance was measured across the frequency range of from 1.0 to 500 kHz using an electrical impedance analyzer (4294A Precision Impedance Analyzer provided by Agilent). The transducer velocity response to a 10 Vpp, 16 cycle sine wave burst was measured using a single point laser vibrometer (OFV-505 vibrometer head with OFV-5000 controller provided by Polytec GmbH). The acoustic output in response to a 5Vpp sine wave, 16 cycle burst was measured using an ultrasonic condenser microphone (Avisoft Bioacoustics e.K., model CM16/CMPA40-5V). The transmission distance was 15 cm (in the case of low frequency transducers) and 8.5 cm (in the case of high frequency transducers). The gain setting on the microphone preamplifier was set to a minimum value for low frequency tests and set to an intermediate value (gain control rotated 180 degrees) for high frequency tests. Transmit-receive performance was measured by selecting a pair of transducers connected by an acrylic tube (FIG. 9) ID 18 mm and length 15 cm (for low frequency tests) and length 8.5 cm (for high frequency tests). A digital oscilloscope was used to capture outputs from laser vibrometer, ultrasonic microphone and transducer transmit-receive tests.

The table in FIG. 10 illustrates a comparison of a conventional transducer with a transducer in accordance with some embodiments discussed herein, for example, low and high frequency multi-element bending mode transducers. Although the velocity response is encouraging in the case of the low frequency (LF) bending mode transducer, the microphone signal is weaker than the current sensor and the transmit-receive sensitivity is substantially lower. The high frequency (HF) bending mode transducer performs worse (note that the microphone signal is not directly comparable with lower frequency measurements due to changed microphone amplifier gain settings). However it may be possible to improve the bending mode transducer performance by improved control of the adhesive bonding process.

Figure 11:
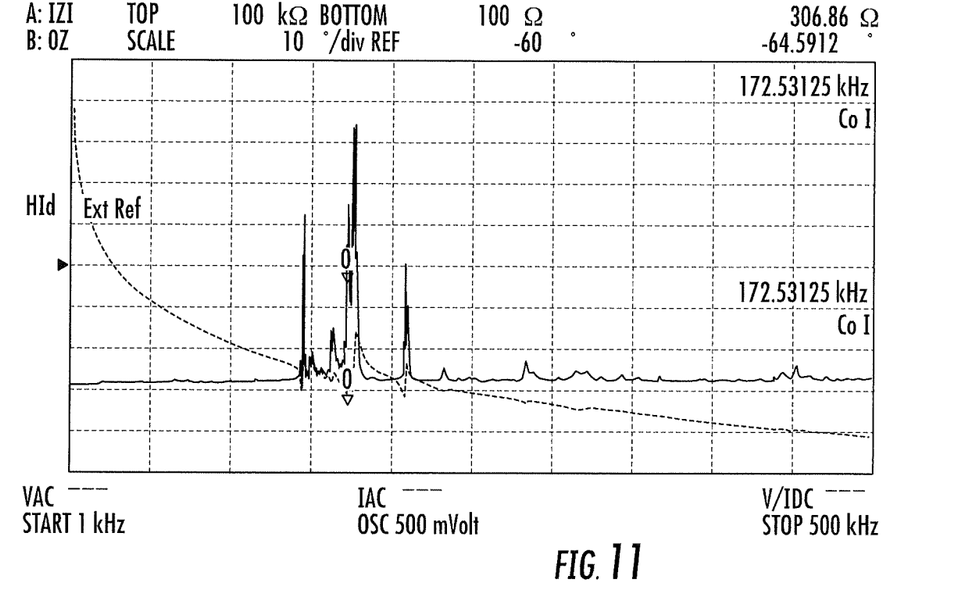
FIGS. 11 and 12 are graphs illustrating electrical impedance spectra and oscilloscope traces showing vibrometer motion, acoustic output and transmit-receive burst response for transducers in accordance with some embodiments of the present inventive concept.
Figure 12:
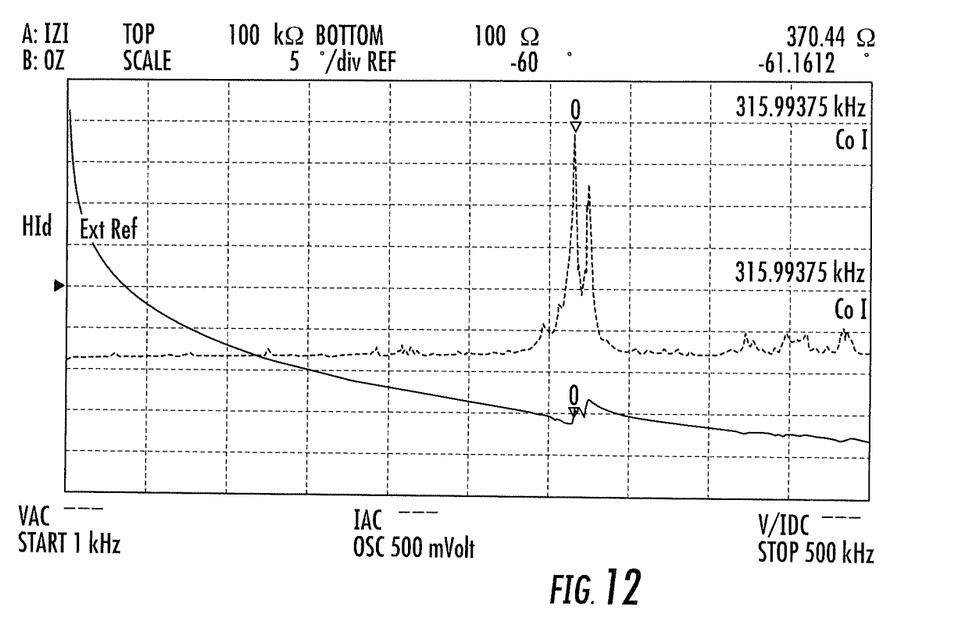
Figure 13:
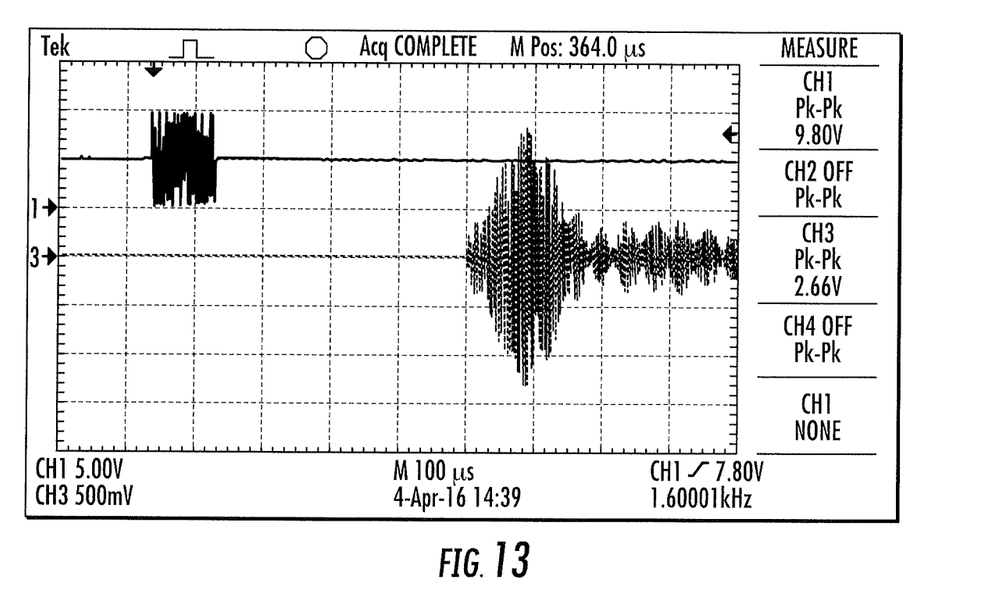
FIGS. 13 and 14 are graphs illustrating a microphone response for a transducer in accordance with some embodiments of the present inventive concept.
Figure 14:
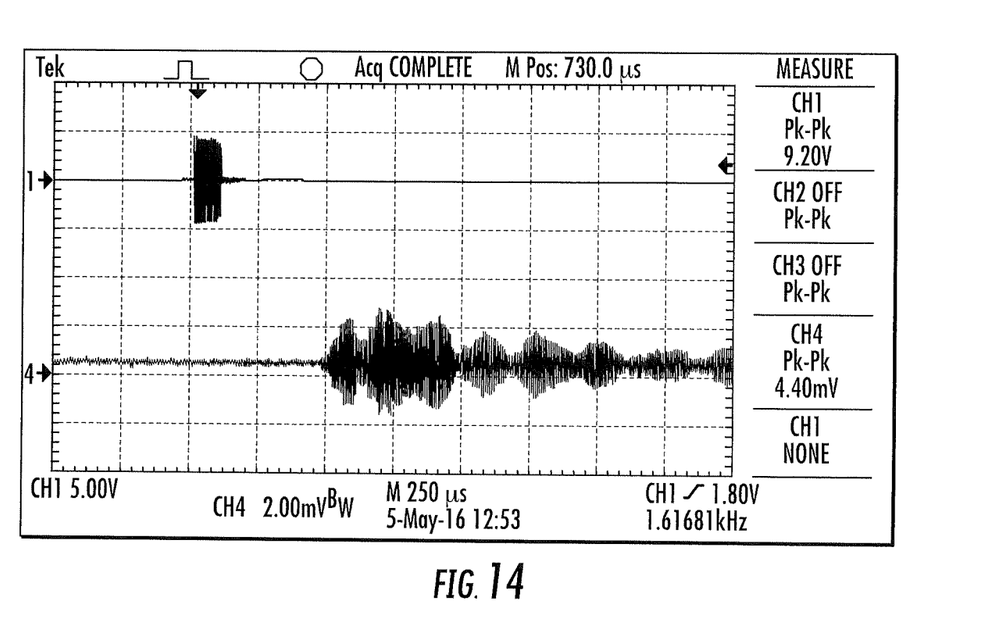

In particular, FIGS. 11 and 12 are graphs illustrating electrical impedance spectra and oscilloscope traces showing vibrometer motion, acoustic output and transmit-receive burst response. FIG. 11 illustrates an electrical impedance spectra for low frequency transducers (device 11763A) and FIG. 12 illustrates electrical impedance spectra for high frequency transducers (device 11757A). FIGS. 13 and 14 are graphs illustrating a microphone response in accordance with embodiments of the present inventive concept. In FIG. 13, the upper trace illustrates a drive signal of a low frequency transducer and the lower trace illustrates a microphone output of the low frequency transducer, device A11761C. In FIG. 14, the upper trace illustrates a drive signal of a low frequency transducer and the lower trace illustrates a receive transducer output of the low frequency transducer, device A11763A and A11763C.

Figure 15:
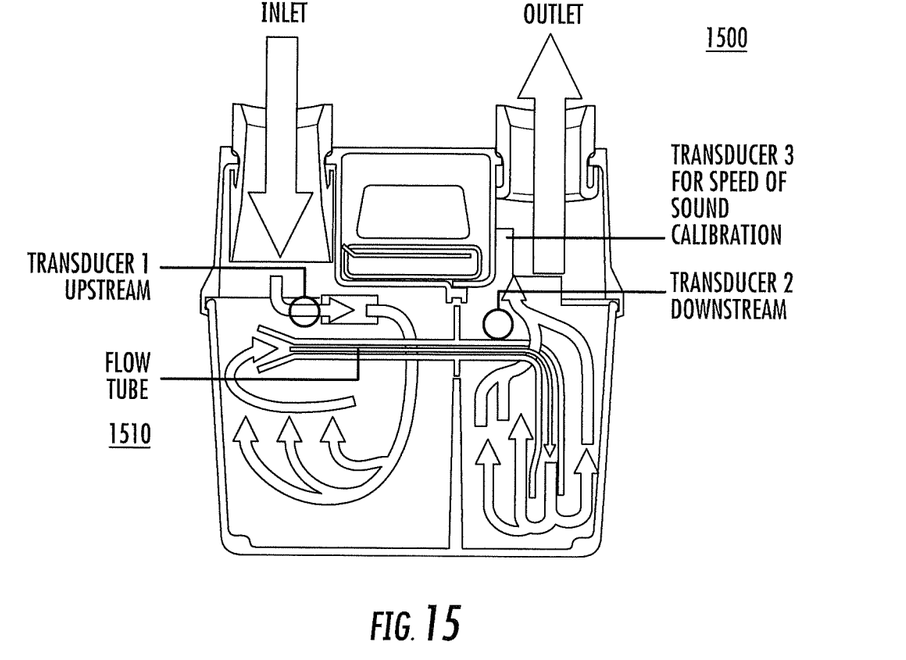
FIG. 15 is a block diagram illustrating an example gas meter including transducers in accordance with embodiments of the present inventive concept.

Transducers in accordance with embodiments discussed herein may be used in any device which lends itself to such transducer. For example, these transducers may be used in water meters, gas meters and the like. By way of example, transducers may be used in gas meters as illustrated in FIG. 15. As illustrated therein, the gas meter 1500 includes three transducers. Transducer 1 (upstream) and transducer 2 (downstream) may be used to measure time-of-flight of an ultrasonic signal along the flow tube 1510 in forward and reverse directions. The gas meter 1500 may also be configured to compensate for gas properties and conditions using a separate sound measurement using transducer 3.

It will be understood that FIG. 15 is provided for example only and embodiments of the present inventive concept are not limited to this configuration. Transducers as discussed herein may be used in many different devices without departing from the scope of the present inventive concept.

As briefly discussed above, some embodiments of the present inventive concept provide multi-element bending transducers that may provide a cost advantage compared to conventional approaches, but equivalent or superior performance. Embodiments discussed herein have performed better at low frequencies. A single element bending mode transducer using a lower operating frequency may be of interest for some applications where long transmission lengths are required (e.g. flow measurement in large diameter pipes).

Example embodiments are described above with reference to block diagrams and/or flowchart illustrations of systems and devices. The functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

In the drawings and specification, there have been disclosed exemplary embodiments of the inventive concept. However, many variations and modifications can be made to these embodiments without substantially departing from the principles of the present inventive concept. Accordingly, although specific terms are used, they are used in a generic and descriptive sense only and not for purposes of limitation, the scope of the inventive concept being defined by the following claims.

That which is claimed is:

1. A bending mode transducer comprising:
   a substrate having a first surface and a second surface, opposite the first surface;
   a piezoelectric layer on the first surface of the substrate, wherein the piezoelectric layer comprises PZT material and has a thickness of from about 20 µm to about 1000 µm;
   at least one patterned electrode on the piezoelectric layer;
   a mounting block on the at least one patterned electrode; and
   at least two electrical contact points on the at least one patterned electrode.

2. The transducer of claim 1, further comprising alignment features on the substrate and/or the mounting block to facilitate alignment during a fabrication process.

3. The transducer of claim 2, wherein the alignment features comprise a plurality of holes and slots in the substrate and/or the mounting block.

4. The transducer of claim 1, wherein the substrate comprises stainless steel and has a thickness of from about 10 µm to about 500 µm.

5. The transducer of claim 1, wherein the mounting block comprises one of a ceramic material and an electrically insulating material.

6. The transducer of claim 1, further comprising an acoustic matching layer on the second surface of the substrate.

7. The transducer of claim 1, wherein the at least one patterned electrode comprises a plurality of patterned electrodes.

8. The transducer of claim 1, wherein the transducer is an ultrasonic transducer configured for one of a gas meter, a water meter and a heat meter.

9. A device, comprising:
   at least one transducer, the at least one transducer comprising:
      a substrate having a first surface and a second surface, opposite the first surface;
      a piezoelectric layer on the first surface of the substrate, wherein the piezoelectric layer comprises PZT material and has a thickness of from about 20 µm to about 1000 µm;
      at least one patterned electrode on the piezoelectric layer;

a mounting block on the at least one patterned electrode; and at least two electrical contact points on the at least one patterned electrode.

10. A method of fabricating transducers, comprising:

providing a substrate including a high density material, the substrate having a first surface and a second surface, opposite the first surface;

bonding a piezoelectric layer and electrodes to the first surface of the substrate;

patterning the electrodes to provide at least one patterned electrode on the piezoelectric layer using a laser ablation process; and bonding a mounting block to the piezoelectric layer and the at least one patterned electrode.

11. The method of claim 10, wherein the electrodes comprise one of gold, nickel and silver.

12. The method of claim 10, wherein bonding the piezoelectric layer and the electrodes further comprises:

applying an adhesive to a surface of the substrate and/or the piezoelectric layer;

compressing the substrate and the piezoelectric layer including the at least one patterned electrode together; and curing the adhesive such that the substrate and the piezoelectric layer are bonded.

13. The method of claim 12, wherein curing comprises curing the adhesive under heat and pressure.

14. The method of claim 12, wherein curing is followed by aligning the substrate with the mounting block using alignment features on the substrate and/or mounting block to facilitate alignment during a bonding process.

15. The method of claim 14, wherein the alignment features comprise a plurality of holes and slots in the substrate and/or the piezoelectric layer.

16. The method of claim 15, further comprising separating the transducers by partitioning the substrate.

17. The method of claim 16, wherein separating further comprises:

cutting the substrate on connecting tabs; and breaking the mounting block along laser-cut scribe lines.

18. The method of claim 10, wherein the mounting block comprises one of a ceramic material and an electrically insulating material.

* * * * *

UNITED STATES PATENT AND TRADEMARK OFFICE
CERTIFICATE OF CORRECTION

PATENT NO. : 11,225,961 B2
APPLICATION NO. : 15/887065
DATED : January 18, 2022
INVENTOR(S) : Justin Rorke Buckland It is certified that error appears in the above-identified patent and that said Letters Patent is hereby corrected as shown below:

On the Title Page

Item (56) References Cited, page 2, Column 2, Other Publications, Line 4, first Gomez cite:
Please correct "Gomez Alvarez-Aren et al."
To read -- Gomez Alvarez-Arenas et al. --

Signed and Sealed this
Fifteenth Day of March, 2022

Drew Hirshfeld
*Performing the Functions and Duties of the*
*Under Secretary of Commerce for Intellectual Property and*
*Director of the United States Patent and Trademark Office*